(12) United States Patent
Bakker et al.

(10) Patent No.: US 10,451,517 B2
(45) Date of Patent: Oct. 22, 2019

(54) VIBRATIONAL TESTING AND CORRELATION

(71) Applicant: ROLLS-ROYCE plc, London (GB)

(72) Inventors: Mattheus Bakker, Gouda (NL); Chian Wong, Derby (GB)

(73) Assignee: ROLLS-ROYCE plc, London (GB)

( * ) Notice: Subject to any disclaimer, the term of this patent is extended or adjusted under 35 U.S.C. 154(b) by 490 days.

(21) Appl. No.: 15/285,193

(22) Filed: Oct. 4, 2016

(65) Prior Publication Data

US 2017/0122835 A1 May 4, 2017

(30) Foreign Application Priority Data

Nov. 2, 2015 (GB) .................................. 1519301.4

(51) Int. Cl.
*G01M 7/02* (2006.01)
*G06F 17/50* (2006.01)
*G01M 15/14* (2006.01)

(52) U.S. Cl.
CPC ............ *G01M 7/025* (2013.01); *G01M 15/14* (2013.01); *G06F 17/5018* (2013.01)

(58) Field of Classification Search
None
See application file for complete search history.

(56) References Cited

U.S. PATENT DOCUMENTS 5,841,030 A 11/1998 Honsberg et al.
7,383,136 B1 * 6/2008 Griffin .................. G01H 1/006
702/56

(Continued)

FOREIGN PATENT DOCUMENTS

EP 2 587 243 A2 5/2013
FR 3 019 297 A1 10/2015
WO 93/15386 A1 8/1993

OTHER PUBLICATIONS

Apr. 27, 2016 Search Report issued in British Patent Application No. 1519301.4.

(Continued)

*Primary Examiner* — Suzanne Lo
(74) *Attorney, Agent, or Firm* — Oliff PLC

(57) ABSTRACT

Methods of vibration testing a component are provided. In a model of the component, define alignment points corresponding to physical features and define measurement points at positions which vibrate when excited at predefined excitation frequencies ($f_e$), the excitation frequencies ($f_e$) each corresponding to one or more vibrational modes. On the component measure the position of the physical features corresponding to the alignment points in the model and calculate the position of the laser source. Excite the component at an excitation frequency and measure the amplitude of vibration at each measurement point. Extract the mode shape from the measured vibration amplitudes. In the model, rotate a local co-ordinate system (x, y, z) at each measurement point until one axis is directed towards the laser source. Extract the mode shape from the component model. Compare the mode shapes extracted from the model and from measured vibration amplitudes.

15 Claims, 6 Drawing Sheets

(56) References Cited

U.S. PATENT DOCUMENTS

Figure 1:
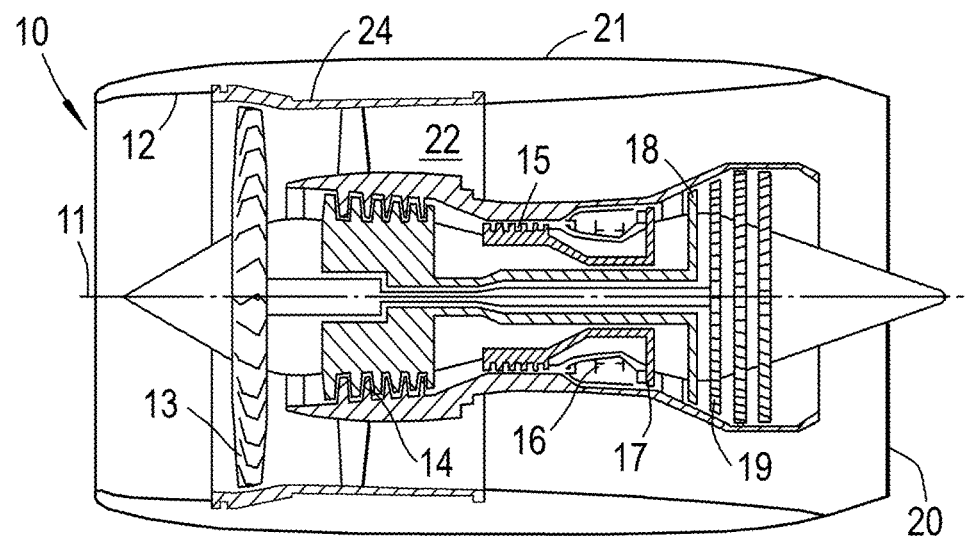

| | | | |
|---|---|---|---|
| 9,739,167 B2* | 8/2017 | Heinig | F01D 21/003 |
| 2011/0314915 A1* | 12/2011 | Adams | G01M 5/0033 |
| | | | 73/582 |
| 2013/0312529 A1* | 11/2013 | Park | G01N 29/2418 |
| | | | 73/657 |

OTHER PUBLICATIONS

Mar. 2, 2017 European Search Report issued in European Patent Application No. 16 19 2221.

* cited by examiner

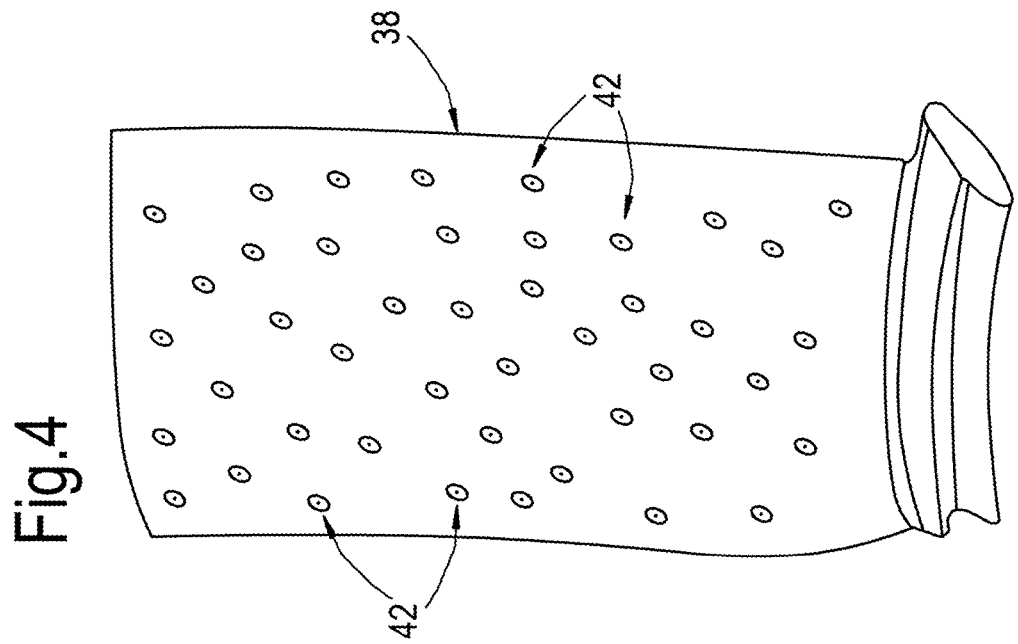
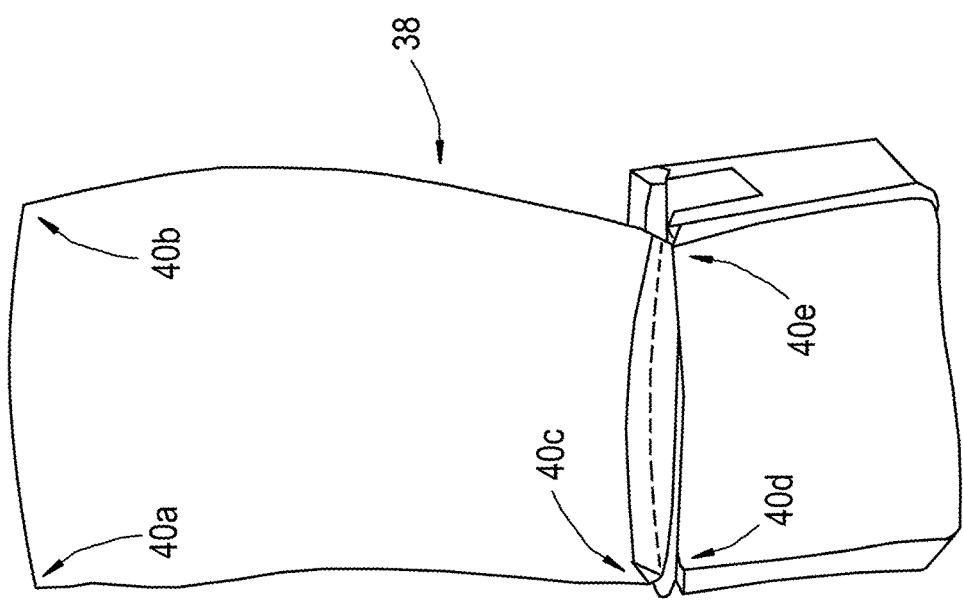

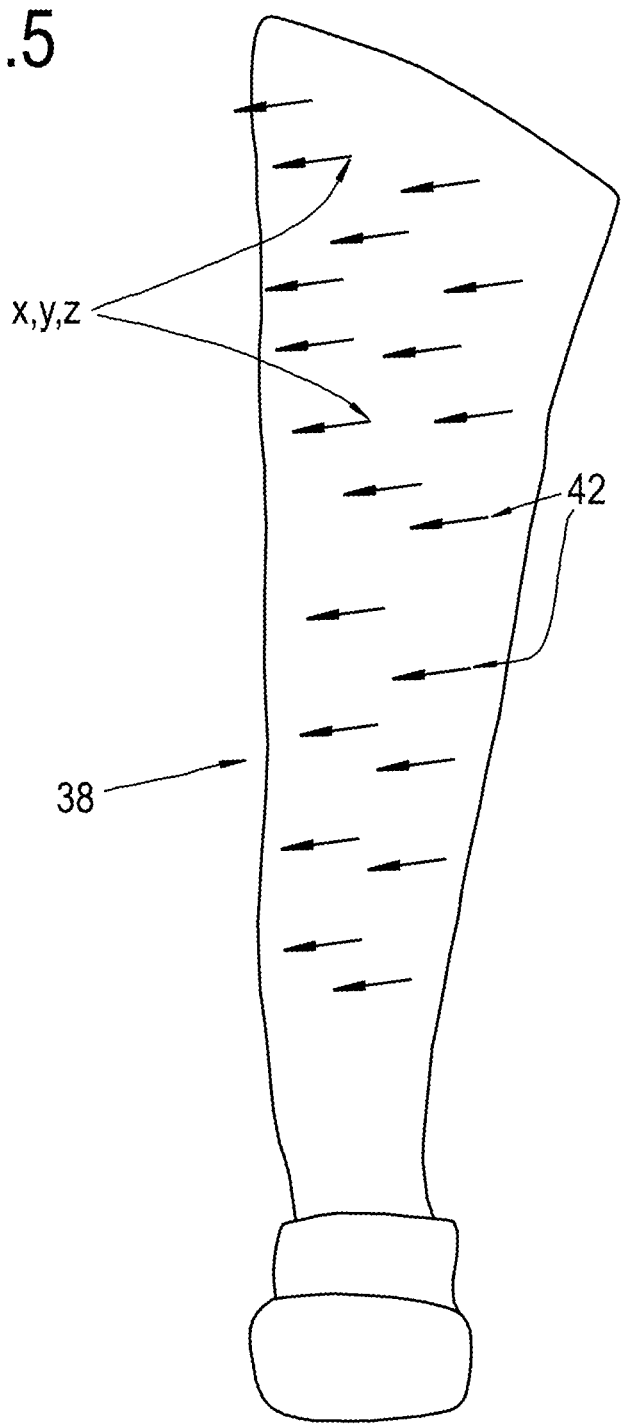

VIBRATIONAL TESTING AND CORRELATION

The present disclosure concerns a method of testing a component to determine vibrational mode shapes or operating deflection shapes.

It is known to test a component for vibrational mode shapes by directing a laser measurement system and a camera towards it. A regular grid mesh is overlaid on the camera image of the component. Intersection nodes of the grid are defined as possible measurement points. The position of several of the measurement points is determined by physical measurement from one or more features of the component, for example using callipers.

One problem with the known method is that the physical measurement from the features of the component is time-consuming and requires high skill. It also risks causing damage to the component by scratching by the callipers.

Another problem is that the component must be positioned relatively far from the camera to reduce the measurement error since the model assumes a planar viewing angle and planar vibration. When the camera is positioned relatively close to the component, parts of the component are viewed with a steep angle and so the image may be distorted. In order to position the component relatively remotely from the camera a large test space is required.

The present invention provides a method which seeks to address these or other problems.

According to a first aspect of the present invention there is provided a method of vibration testing of a component, the method comprising steps to:
 a) in a model of the component, define alignment points corresponding to physical features of the component;
 b) in the model, define measurement points at positions which vibrate when excited at predefined excitation frequencies, the excitation frequencies each corresponding to one or more vibrational modes;
 c) on the component measure, using a laser source, the position of the physical features corresponding to the alignment points in the model and calculate the position of the laser source;
 d) excite the component at an excitation frequency and measure the amplitude of vibration at each measurement point using the laser;
 e) extract the mode shape or operating deflection shape from the measured vibration amplitudes;
 f) in the model, rotate a local co-ordinate system at each measurement point until one axis is directed towards the laser source;
 g) in the model, extract the mode shape or operating deflection shape in the frequency range of interest from the component model; and
 h) compare the mode shapes or operating deflection shapes extracted from the model and from the measured vibration amplitudes.

Advantageously the method allows mode shapes or operating deflection shapes to be extracted from the component vibration when viewed by the laser source from an arbitrary direction. The mode shapes or operating deflection shapes can then be compared to those extracted from the equivalent model of the component regardless of the relative orientation of the component and the stored model.

The physical features may comprise corners of the component. Advantageously such features are visually clear to the laser and so no physical measurement on the component is required. Advantageously this means that the component is not at risk of damage, for example scratching by callipers, unlike in previous methods of vibration testing.

The component may comprise four or more physical features corresponding to alignment points in the model. Advantageously four features provide sufficient angle measurements to determine the position of the laser source at step c). Where more than four features are defined there is redundancy. There is also more freedom on the viewing angle from the laser source because if one feature is wholly or partially obscured the other four (or more) features remain visible to the laser and so its position can be determined.

The model may comprise a finite element model. Advantageously such models are often generated during design of components so there is no additional modelling burden to implement the method of the present invention.

The laser source may comprise a one-dimensional scanning laser. Advantageously one-dimensional lasers are considerably cheaper than three-dimensional lasers. Advantageously the method enables vibration information about a three-dimensional component to be determined from the one-dimensional laser.

Steps f) and g) may be performed before steps d) and e). Alternatively steps f) and g) may be performed in parallel to steps d) and e). Advantageously the excitation of the component and extraction of mode shapes or operating deflection shapes is independent of the manipulation of the model and extraction of the mode shapes or operating deflection shapes therefrom.

Steps d) to h) may be repeated at a different excitation frequency or at more than one different excitation frequency. Advantageously the measurement points can have been optimised in the model so that multiple mode shapes or operating deflection shapes can be extracted from vibration measurements by applying different excitation frequencies but measuring the amplitude of vibration at the same measurement points.

Step d) may comprise exciting the component at a plurality of excitation frequencies and step e) may comprise extracting multiple mode shapes or operating deflection shapes from the measured vibration amplitudes. A scanning laser may be particularly suitable for exciting the component in this manner, for example by sweeping through a range of frequencies. The scanning laser may sweep through a range of 20 Hz to 200 Hz, for example. Advantageously by exciting the component at a plurality of excitation frequencies and extracting the shapes therefrom the testing time is reduced relative to repeated tests.

The method may comprise a further step to update the model if the difference between the modelled and calculated (from vibration measurements) mode shapes or operating deflection shapes is greater than a predefined threshold. Advantageously the method is improved iteratively.

The method may then comprise repeating steps f) and g) in the updated model and comparing the extracted mode shapes or operating deflection shapes therefrom with the shapes extracted from the measured vibration amplitudes. Advantageously it is not necessary to repeat all the steps of the method when the model is updated.

The method may further comprise steps to:
 a) realign the component relative to the laser source; and
 b) repeat the method as described above.

Advantageously these steps can be used to validate the results from the previous run of the method. Advantageously and alternatively these steps can be combined with the results from the previous run of the method to build information about the three-dimensional vibration response of the component even when using a one-dimensional laser. Advantageously the method is applicable to very large components because the realignment and repetition of these steps can direct the laser to measurement points on a different part of the component which was not visible to the laser in an earlier repetition of the method.

The measurement points may comprise a subset of all points on the component which vibrate when excited at the predefined excitation frequencies. Advantageously it is not necessary to measure vibration at all possible points on the component in order to extract the mode shapes or operating deflection shapes. Advantageously the subset can be optimised in the model.

The component may be a component of a gas turbine engine. The component may be any one of: a fan blade; a compressor blade; a compressor vane; a turbine blade; a turbine vane; a rotor assembly such as a bladed disc or bladed ring; a casing; a nacelle; a strut; or a pylon. Advantageously the component may comprise a single component or an assembly of components or a sub-system.

In a second aspect of the present invention there is provided a vibration testing system comprising:
 a) a component to be tested;
 b) an exciter configured to excite the component at a predefined frequency;
 c) a laser source positioned to measure amplitude of vibration of measurement points on the component; and
 d) a processor to receive measurements from the laser source and to perform the steps of the method as described above.

Advantageously the vibration testing system can be operated in a smaller test space than previous testing systems because step f) of the method compensates for any mismatch between the orientation of the model and the positions of the component and laser source. Advantageously the vibration testing system can be set up more quickly and with less accuracy than previous testing systems because the method implemented by the processor precisely determines the spacing of and angles between the component and laser source. Advantageously this means the vibration testing system is cheaper than previous systems.

The laser source may be a one-dimensional scanning laser. Advantageously such a laser is cheaper than a three-dimensional laser.

The laser may include a camera or equivalent equipment in order to align the laser beam with the physical features of the component which correspond to the alignment points in the model. Advantageously such equipment is conventional with a scanning laser.

The processor may be integrated with the laser source or may be remote therefrom. The processor may also generate control signals to control the exciter and/or the laser source. Alternatively a controller may generate such control signals.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

Figure 2:
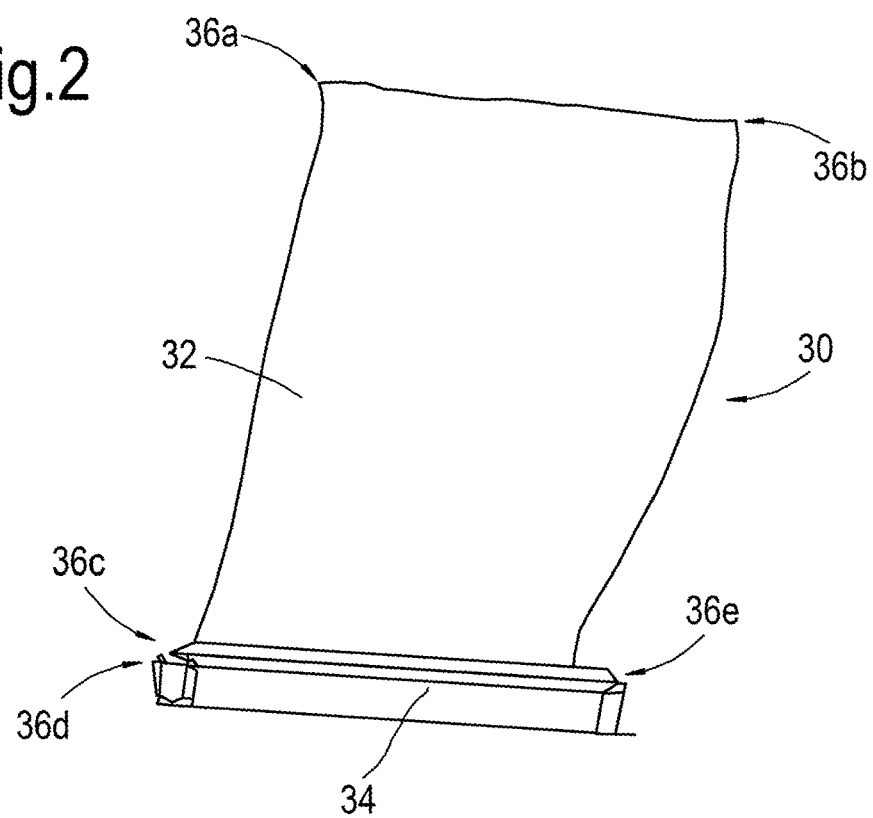
Figure 6:
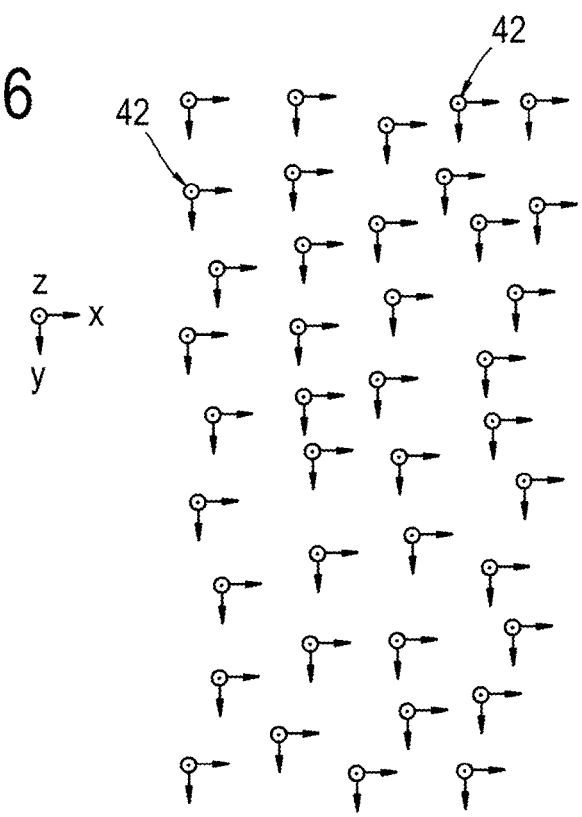
Figure 7:
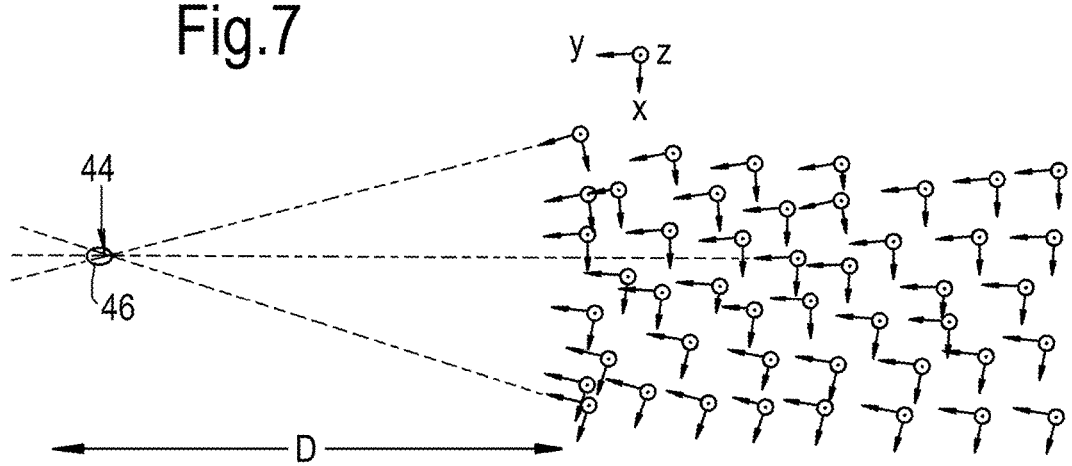
Figure 8:
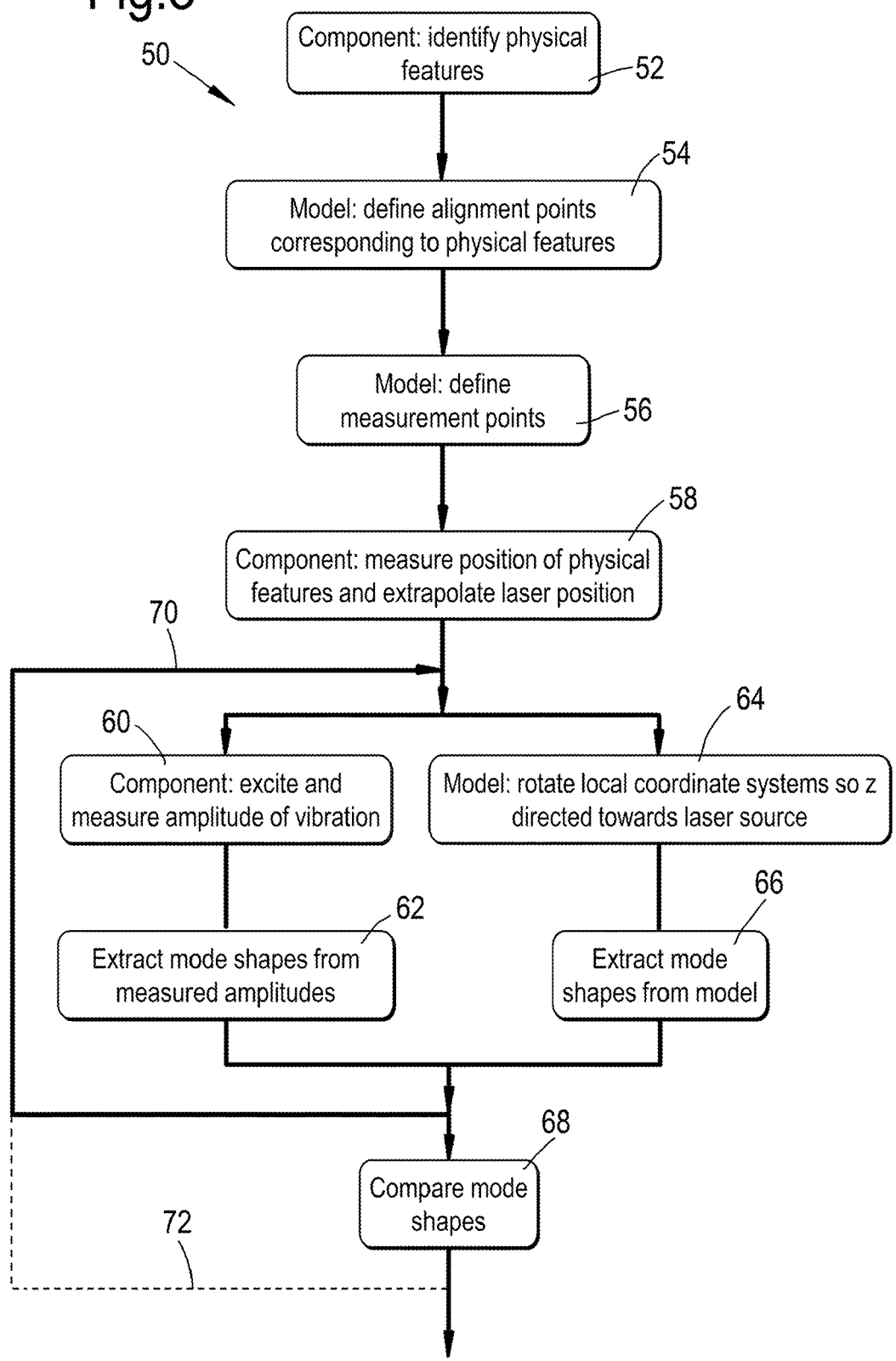
Figure 9:
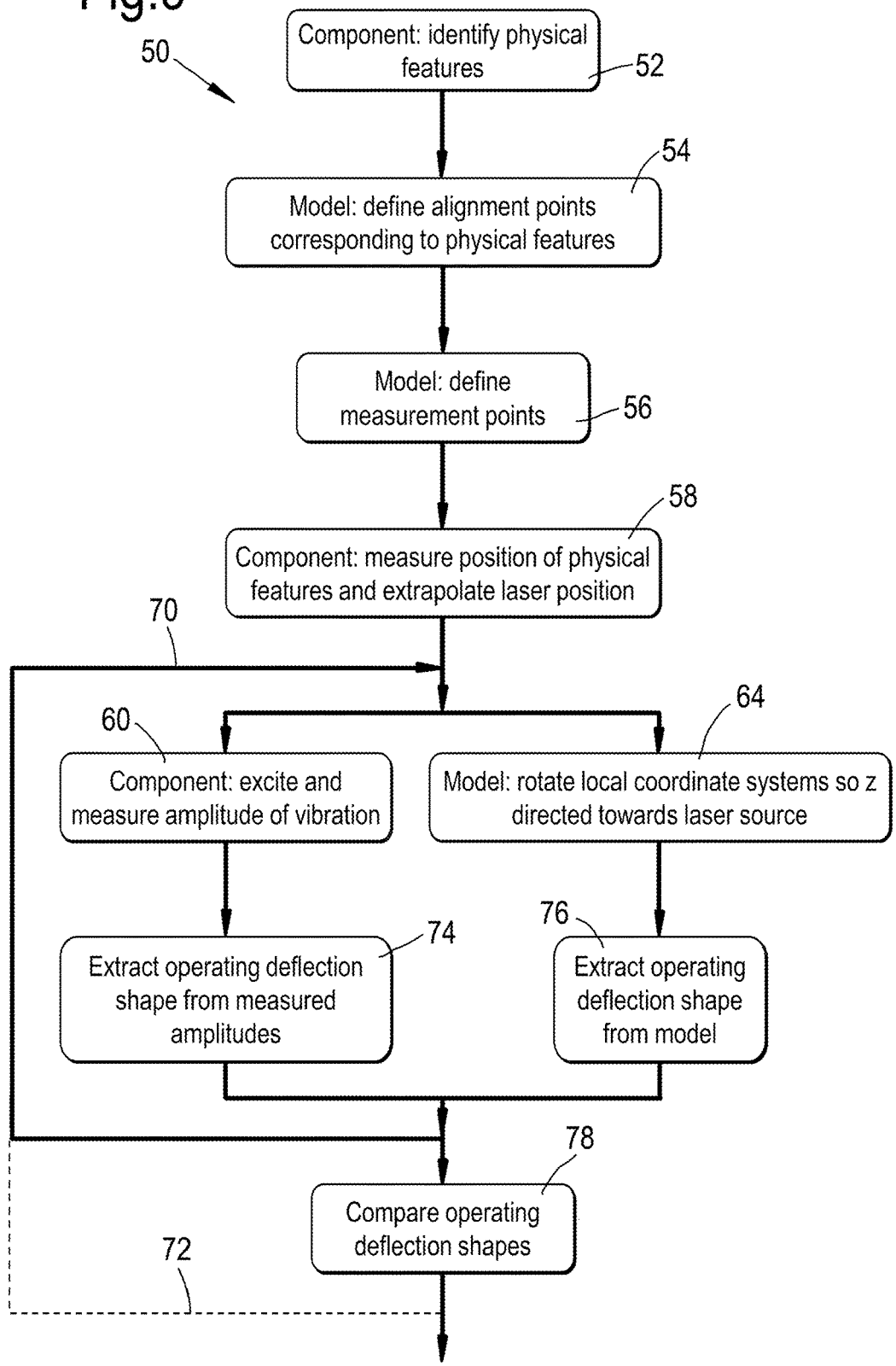

Embodiments will now be described by way of example only, with reference to the Figures, in which:
 FIG. 1 is a sectional side view of a gas turbine engine;
 FIG. 2 is a perspective side view of a compressor blade;
 FIG. 3 is a perspective side view of a model of the compressor blade of FIG. 2;
 FIG. 4 is a perspective side view of the model of FIG. 3 showing measurement points;
 FIG. 5 is perspective view of the model of FIG. 3 showing local coordinates at measurement points;
 FIG. 6 is a representation of the local coordinates;
 FIG. 7 is a representation similar to FIG. 6;
 FIG. 8 is a flow chart of the method;
 FIG. 9 is a flow chart of a modification of the method.

With reference to FIG. 1, a gas turbine engine is generally indicated at 10, having a principal and rotational axis 11. The engine 10 comprises, in axial flow series, an air intake 12, a propulsive fan 13, an intermediate pressure compressor 14, a high-pressure compressor 15, combustion equipment 16, a high-pressure turbine 17, and intermediate pressure turbine 18, a low-pressure turbine 19 and an exhaust nozzle 20. A nacelle 21 generally surrounds the engine 10 and defines both the intake 12 and the exhaust nozzle 20.

The gas turbine engine 10 works in the conventional manner so that air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place.

The compressed air exhausted from the high-pressure compressor 15 is directed into the combustion equipment 16 where it is mixed with fuel and the mixture combusted. The resultant hot combustion products then expand through, and thereby drive the high, intermediate and low-pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by suitable interconnecting shaft.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

A component 30 is shown in FIG. 2. The component 30 is a compressor blade 32 for a gas turbine engine 10 held in a fixture 34. Five prominent physical features 36 of the component 30 are chosen. These are the leading edge tip 36a, the trailing edge tip 36b, the leading edge blade root 36c, the front of the fixture 36d and the rear of the fixture 36e. The physical features 36 are prominent corners of the component 30 so that they are clearly visually identifiable. Advantageously this means that there is no need to measure from the edge of the component 30 with callipers and so the risk of scratching the component 30 during measuring is removed.

A model 38 of the component 30 is shown in FIG. 3. The model 38 is, for example, a three-dimensional finite element model of the component 30. Alignment points 40 are defined at positions which correspond to the physical features 36 on the component 30. Thus the alignment point 40a corresponds to the leading edge tip 36a; the alignment point 40b to the trailing edge tip 36b; the alignment point 40c to the leading edge blade root 36c; the alignment point 40d to the front of the fixture 36d; and the alignment point 40e to the rear of the fixture 36e.

Although five physical features 36 and five corresponding alignment points 40 are defined, fewer or more physical features 36 and corresponding alignment points 40 may be defined instead. A minimum of four physical features 36, and thus four corresponding alignment points 40, are required. The features 36 must not be linearly aligned. By identifying five physical features 36 there is redundancy. This is beneficial if one of the features 36 is visually obscured by the viewing angle.

The model 38 is shown in FIG. 4. A plurality of measurement points 42 are indicated as dots on the surface of the component model 38. The measurement points 42 form an irregular array. Each measurement point 42 corresponds to a position on the component 30 which vibrates when an excitation frequency $f_e$ is applied to the component 30. Specifically the excitation frequency $f_e$ is chosen to excite a vibration mode of the component 30. Some of the measurement points 42 vibrate in response to more than one mode.

In order to reduce the testing time it is desirable to minimise the number of measurement points 42 selected for testing. Thus a subset of measurement points 42 is chosen, for example 5 to 100, 10 to 50, 10 to 20 or 10 to 15 measurement points 42 may be chosen. Preferably the measurement points 42 in the subset include some or all of those which vibrate in response to more than one vibrational mode of interest, although it may also include one or more measurement point 42 which only vibrates in response to one vibrational mode of interest.

The component 30 can be described in three-dimensional space by orthogonal Cartesian coordinates X, Y, Z. These are referred to herein as the global coordinate system. At any point on the component 30 local coordinate systems x, y, z can be defined. They may be parallel to the global coordinate system X, Y, Z, that is each local coordinate axis is parallel to the equivalent global coordinate axis, or may be differently orientated to the global coordinate system X, Y, Z. FIG. 5 shows the model 32 with the local coordinate systems x, y, z superimposed at each measurement point 42.

As can be seen more clearly in FIG. 6 and FIG. 7, the local coordinate systems x, y, z at each measurement point 42 can be rotated so that one of the axes, for example the z-axis, at each measurement point 42 is directed to the same position 44 in space. This position 44 is where a laser source 46 is positioned relative to the component 30 for the testing. Thus the local z-axis at each measurement point 42 is aligned with the direction (shown by dotted lines for exemplary ones) from which the laser light will reach that point 42 on the component 30 from the laser source 46 at the position 44. For a relatively large component 30 there will be a visually apparent convergence of the directions of the local z-axes. For a smaller component 30 the convergence will also be present but will be less visually apparent.

A method 50 of vibration testing of a component 30 is shown in the flow chart of FIG. 8. In the method 50, the first step is to create the model 38 of the component 30. Then prominent physical features 36 of the component 30, for example corners, are identified (box 52). Then the position in the global coordinate system X, Y, Z of each of the alignment points 40, which correspond to the prominent physical features 36, is identified in the model 38 (box 54).

Next measurement points 42 in the model 38 are identified (box 56) which correspond to positions on the component 30 which vibrate at one or more predefined excitation frequency $f_e$. Each excitation frequency $f_e$ corresponds to one or more vibrational mode of interest. Thus multiple vibration modes may be excited at a single excitation frequency $f_e$. However, a single vibration mode can be extracted from the measurements by appropriate selection of the excitation frequency $f_e$, measurement points 42 and direction of measurement. Preferably the direction of measurement is approximately aligned with the direction of maximum displacement. Advantageously the locations of the measurements points 42 can be optimised within the model 38.

Preferably a subset of the measurement points 42 is selected for the testing in order to reduce the time required for the testing. The subset preferably includes some or all of the measurement points 42 which vibrate at more than one excitation frequency $f_e$ corresponding to a vibrational mode of interest. The subset may also include one or more measurement points 42 each of which only vibrates at one excitation frequency $f_e$ corresponding to one vibrational mode of interest. Advantageously the number and positions of the measurement points 42 in the subset can be optimised within the model 38.

In the next step the component 30 and a laser source 46 are positioned in a test space. Using the laser source 46 the position of each of the physical features 36 is determined and given the coordinates of its corresponding alignment point 40 in the global coordinate system X, Y, Z. Then the position 44 of the laser source 46 is extrapolated from the angle of measurement to each of the physical features 46 corresponding to the alignment points 40. Where four alignment points 40 at known positions in the global coordinate system X, Y, Z are measured, eight angles are found. These angles are used to calculate the position 44 of the laser source 46. Where more than four alignment points 40 are measured a least squares fit may be used to determine the position 44 of the laser source 46. Identifying the positions of the physical features and extrapolating the position 44 of the laser source 46 is step 58 of the method 50. Advantageously this enables a less accurate set up of the laser source 46 and component 30 in the test space as the extrapolation of the position 44 of the laser source 46 gives a precise and accurate definition of the spacing and angles between the laser source 46 and the component 30. Thus the physical set up is a quicker and less skilled job, with consequent cost savings.

In the next step, box 60, the component 30 is excited at a first excitation frequency $f_e$. The laser source 46 is directed in turn towards each measurement point 42 of the subset. The laser source 46 is a one-dimensional laser and is configured to measure the amplitude of vibration in the direction of the vector connecting the laser source 46 to the measurement point 42. A dwell time of a few seconds, for example 4 s to 8 s, is required to measure the amplitude of vibration. A set of amplitude measurements is therefore generated for the first excitation frequency $f_e$.

Step 62 comprises extracting the mode shape from the measured amplitudes of vibration. The vibrational mode shape can be determined from the measured vibration amplitudes through experimental modal analysis. Optionally the resonant frequencies can also be extracted in this step. Each vibrational mode causes the measurement points 42 within the subset to vibrate in different directions and therefore to have a different amplitude of vibration in the direction in which the laser source 46 views the component 30.

In practical implementations of the method 30 the step 60 may comprise sweeping through a range of frequencies, for example between 20 Hz and 200 Hz, in one excitation step. Thus step 62 comprises extracting multiple mode shapes from the measured vibration amplitudes.

At step 64 the local coordinate system x, y, z at each measurement point 42 in the model 38 is rotated until one of the axes, for example the z-axis, is directed towards the position 44 of the laser source 46 as determined at step 58. The local coordinate system x, y, z at one or more of the measurement points 42 may not need to be rotated, if it already has the appropriate axis aligned with the vector from the position 44 of the laser source 46. The closer the laser source 46 is positioned to the component 30 the greater the rotation that will be required of the local coordinate systems x, y, z. Advantageously the laser source 46 can be positioned much closer to the component 30 than in previous testing arrangements and so the required test space is smaller. Further advantageously, the rotation of the local coordinate systems x, y, z at each measurement point 42 compensates any mismatch between the orientation of the model 38 and the positions of the component 30 and laser source 46 in the test space.

At step 66 the mode shapes are extracted from the model 38 by normal modal analysis. Thus mass and stiffness matrices are input rather than the frequency responses used in step 62.

As is apparent from the flow chart in FIG. 8, the steps 60 and 62 are performed in parallel to the steps 64 and 66. Thus steps 64 and 66 may be performed before, at the same time as or after the steps 60 and 62 (and vice versa).

Periodically the accuracy of the finite element model 38 may be checked using the results of the preceding steps 52 to 66 of the method 50. The mode shapes determined from the model 38 and from the component 30 are compared, for example by applying a correlation algorithm, box 68. If the mode shapes extracted for the same excitation frequency $f_e$ match perfectly the correlation will be 1.

A threshold that is less than 1 can be set as the acceptable level of correlation. The correlation value from the comparison can then be tested against the threshold. If the comparison correlation value is too low (less than the threshold) the inference is that the model 38 is an inaccurate representation of the physics of the component 30 and so should be redefined or updated. Thus a model 38 of the component 30 as designed may be updated to better match a production component 30 made to the design but with some differences.

As shown by iteration loop 70, the component 30 may be excited at a second excitation frequency $f_e$ and the laser source 46 directed in turn towards each measurement point 42 of the subset to measure the vibration amplitude in the z-axis direction. The vibrational mode shape corresponding to this set of measurements can then be determined. These steps can be iterated for as many different excitation frequencies $f_e$ as desired to measure for all the vibrational modes of interest.

Similarly the excitation at the second (and subsequent) excitation frequencies $f_e$ may be simulated in the model 38 and the mode shapes and resonant frequencies extracted.

Dotted line 72 indicates that the iteration loop 68 may occur before or after the mode shapes extracted for a given excitation frequency $f_e$ are compared, box 68. Where the iteration occurs before the comparison step 68 multiple pairs of mode shapes may be compared in step 68, each pair defined by their common excitation frequency $f_e$.

Optionally all the steps of the method 50 can be repeated with the relative position and/or orientation of the laser source 46 and the component 30 different. This may simply enable the calculated vibrational mode shapes to be validated by repetition. Alternatively, if the relative position and/or orientation are sufficiently different, vibrational modes which were not visible from the direction of vibration of the measurement points 42 in the first alignment may be visible in a second alignment of the component 30 and laser source 46.

If the steps of the method 50 are repeated at least three times, each with a different relative position and/or orientation between the component 30 and laser source 46 and each orientation not aligned with the other repetitions, three-dimensional vibration can be reconstructed by the three (or more) sets of vibration amplitude measurements. Advantageously a one-dimensional laser source 46, for example a one-dimensional scanning laser can to be used to reconstruct three-dimensional vibration patterns which is much cheaper than using a three-dimensional laser.

The vibrational mode shapes, once calculated, may be used to inform design changes to reduce movement of some or all of the parts of the component 30, to lighten the component 30 or change its weight distribution by removing material, or to modify the component stiffness. The mode shapes may also be used to inform the application of vibration damping to the component 30.

In a modification of the method 50, shown in FIG. 9, steps 62, 66 and 68 are replaced by steps 74, 76 and 78 respectively. At step 74 the operating deflection shape is extracted from the measured amplitudes of vibration. At step 76 the operating deflection shape is extracted from the model 38. Operating deflection shape is a property of both the structure and the excitation applied whereas mode shape is purely a property of the structure. The structure may contain non-linear terms. At step 78 the operating deflection shapes are compared. Thus wherever mode shapes have been discussed herein operating deflection shapes can be substituted with equal felicity.

Although a finite element model 38 has been proposed an alternative type of model 38 may be substituted instead, such as an applied element model 38.

Although a compressor blade 32 and fixture 34 has been used as the component 30 in the description of the invention, the method 50 can be applied other components. For example, other gas turbine engine 10 components may be tested for vibrational mode shapes using the method 50. Such components 30 include but are not limited to fan blades, compressor vanes, turbine blades and turbine vanes. Rotor assemblies, blisks (bladed discs), blings (bladed rings) and casings may also be tested using the method 50. The nacelle 21 and the pylon which attaches a gas turbine engine 10 to an aircraft may be tested using the method 50. Large components 30 may require multiple measurements with the relative positions of the laser source 46 and component 30 substantially changed. For example, with an annular casing it may be necessary to rotate the casing between measurements because the whole casing cannot be within the viewing angle of the laser source 46 at once.

The method 50 of the present invention also finds utility for components 30 in other products and from other industries in which vibration modes must be calculated and analysed. For example the method 50 may be performed on a pipe or casing, whether from a gas turbine engine 10 or another product. It may be applied to the chassis and wheels of a road or rail vehicle. It may also be applied to marine equipment such as deck handling gear and winches. As will be apparent to the skilled reader, some components 30 which are used in harsh, unpredictable or inaccessible locations may need to be tested in a more artificial environment, such as a test facility.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

The invention claimed is:

1. A method of vibration testing of a component, the method comprising steps to:
   a. in a model of the component, define alignment points corresponding to physical features of the component;
   b. in the model, define measurement points at positions which vibrate when excited at predefined excitation frequencies, the excitation frequencies each corresponding to one or more vibrational modes;
   c. on the component measure, using a laser source, the position of the physical features corresponding to the alignment points in the model and calculate the position of the laser source;
   d. excite the component at an excitation frequency and measure the amplitude of vibration at each measurement point using the laser;
   e. extract the mode shape or operating deflection shape from the measured vibration amplitudes;
   f. in the model, rotate a local co-ordinate system at each measurement point until one axis is directed towards the laser source;
   g. perform modal analysis on the model or apply the excitation frequency to the model;
   h. in the model, extract the mode shape or operating deflection shape in the frequency range of interest from the component model; and
   i. compare the mode shapes or operating deflection shapes extracted from the model and from measured vibration amplitudes.

2. The method as claimed in claim 1, wherein the physical features comprise corners of the component.

3. The method as claimed in claim 1, wherein the component comprises four or more physical features corresponding to alignment points in the model.

4. The method as claimed in claim 1, wherein the model comprises a finite element model.

5. The method as claimed in claim 1, wherein the laser source comprises a one-dimensional scanning laser.

6. The method as claimed in claim 1, wherein steps 1.f and 1.h are performed before or in parallel with steps 1.d and 1.e.

7. The method as claimed in claim 1, wherein steps 1.d to 1.i are repeated at a different excitation frequency.

8. A method of vibration testing of a component, the method comprising steps to:
   a. in a model of the component, define alignment points corresponding to physical features of the component;
   b. in the model, define measurement points at positions which vibrate when excited at predefined excitation frequencies, the excitation frequencies each corresponding to one or more vibrational modes;
   c. on the component measure, using a laser source, the position of the physical features corresponding to the alignment points in the model and calculate the position of the laser source;
   d. excite the component at a plurality of excitation frequencies;
   e. extract multiple mode shapes or operating deflection shapes from the measured vibration amplitudes
   f. in the model, rotate a local co-ordinate system at each measurement point until one axis is directed towards the laser source;
   g. perform modal analysis on the model or apply the excitation frequencies to the model;
   h. in the model, extract the mode shape or operating deflection shape in the frequency range of interest from the component model; and
   i. compare corresponding mode shapes or corresponding operating deflection shapes extracted from the model and from measured vibration amplitudes.

9. The method as claimed in claim 1, further comprising a step to update the model if the difference between the modelled and calculated mode shapes or operating deflection shapes is greater than a predefined threshold.

10. The method as claimed in claim 9, further comprising repeating steps 1.f, 1.g and 1.h in the updated model and comparing the extracted mode shapes or operating deflection shapes obtained from repeating steps 1.f and 1.g in repeated step 1.h.

11. The method as claimed in claim 1, further comprising steps to:
   a. realign the component relative to the laser source; and
   b. repeat the method as claimed in claim 1.

12. The method as claimed in claim 1, wherein the measurement points comprise a subset of all points on the component which vibrate when excited at the predefined excitation frequencies.

13. The method as claimed in claim 1, wherein the component comprises a component of a gas turbine engine.

14. The method as claimed in claim 13 wherein the component comprises any one of: a fan blade; a compressor blade; a compressor vane; a turbine blade; a turbine vane; a rotor assembly; a casing; a nacelle; a strut; a pylon.

15. A vibration testing system comprising:
   a. a component to be tested;
   b. an exciter configured to excite the component at a predefined frequency;
   c. a laser source positioned to measure amplitude of vibration of measurement points on the component; and
   d. a processor programmed to receive measurements from the laser source and to perform the steps of the method according to claim 1.

* * * * *